United States Patent
Abe

(10) Patent No.: US 8,030,939 B2
(45) Date of Patent: Oct. 4, 2011

(54) ELECTRONIC APPARATUS AND CONTROLLING METHOD FOR THE SAME

(75) Inventor: Takamitsu Abe, Inagi (JP)

(73) Assignee: Canon Kabushiki Kaisha (JP)

( * ) Notice: Subject to any disclaimer, the term of this patent is extended or adjusted under 35 U.S.C. 154(b) by 493 days.

(21) Appl. No.: 12/202,409

(22) Filed: Sep. 1, 2008

(65) Prior Publication Data

US 2009/0058423 A1   Mar. 5, 2009

(30) Foreign Application Priority Data

Aug. 30, 2007 (JP) ................................ 2007-224555

(51) Int. Cl.
*G01N 27/416* (2006.01)
*H02J 7/00* (2006.01)
(52) U.S. Cl. ........................ 324/426; 320/133
(58) Field of Classification Search .................. 324/426; 320/133
See application file for complete search history.

(56) References Cited

U.S. PATENT DOCUMENTS

| | | | | |
|---|---|---|---|---|
| 5,608,324 | A | * | 3/1997 | Yoshida ........................ 324/426 |
| 6,563,318 | B2 | * | 5/2003 | Kawakami et al. ........... 324/426 |
| 7,514,902 | B2 | * | 4/2009 | Tsuchiya et al. .............. 320/132 |

FOREIGN PATENT DOCUMENTS

JP    9-297166 A    11/1997

* cited by examiner

*Primary Examiner* — M'Baye Diao
(74) *Attorney, Agent, or Firm* — Rossi, Kimms & McDowell LLP

(57) ABSTRACT

An electronic apparatus which is capable of correctly displaying the remaining usable time even if a discharged current of a battery pack is changed by an unexpected load due to an external apparatus connected. The electronic apparatus has a battery pack with a secondary battery mounted therein. A first remaining usable time of the electronic apparatus is calculated based on a consumed current of the electronic apparatus. A second remaining usable time of the electronic apparatus is calculated based on a discharged current of the secondary battery. The first remaining usable time calculated by the first remaining usable time calculating unit or the second remaining usable time calculated by the second remaining usable time calculating unit, whichever is smaller, is selected, and then a displaying unit displays the selected remaining usable time.

14 Claims, 6 Drawing Sheets

ELECTRONIC APPARATUS AND CONTROLLING METHOD FOR THE SAME

BACKGROUND OF THE INVENTION

1. Field of the Invention

The present invention relates to an electronic apparatus and a controlling method for the same, and more particularly, to an electronic apparatus having functions of calculating a remaining usable time for the electronic apparatus based on a remaining capacity of a battery pack and for displaying a result of the calculation, and a controlling method for the electronic apparatus.

2. Description of the Related Art

A conventional video camera includes a microcomputer and a current detecting circuit in a battery pack, with which a charge capacity is calculated by accumulating charge-discharge current of a battery cell, remaining capacity information on the battery cell is transmitted to the video camera, and a remaining usable time is displayed on the video camera. Some of the conventional video cameras calculate and display the usable time for each of a plurality of operation modes such as a camera mode and a reproducing mode (for example, refer to Japanese Laid-Open Patent Publication (Kokai) No. H09-297166).

However, the above conventional video camera suffers from a problem that a correct remaining usable time cannot be displayed with an unexpected load induced, for example, when an external apparatus such as a video light is connected to the video camera.

In the conventional video camera, a power may be delivered from the battery pack through a DC/DC converter. In this case, a load on the battery cell in the battery pack is close to a constant power. When a typical lithium-ion cell used for the battery pack is discharged at a constant power, as shown in FIG. 6, the amount of discharged current is smaller under a high voltage condition at the beginning of discharge than under a low voltage condition at the end of discharge. At this time, if the remaining usable time is calculated from the discharged current and the remaining capacity of the battery pack, the calculated remaining usable time becomes longer than the correct remaining usable time since the discharged current is smaller at the beginning of discharge.

SUMMARY OF THE INVENTION

The present invention has been made in consideration of the above problems, and provides an electronic apparatus which is capable of correctly displaying the remaining usable time even if a discharged current of a battery pack is changed by an unexpected load due to an external apparatus connected, and a controlling method for the electronic apparatus.

In a first aspect of the present invention, there is provided an electronic apparatus having a battery pack with a secondary battery mounted therein, comprising: a first remaining usable time calculating unit adapted to calculate a first remaining usable time of the electronic apparatus based on a consumed current of the electronic apparatus; a second remaining usable time calculating unit adapted to calculate a second remaining usable time of the electronic apparatus based on a discharged current of the secondary battery; a selecting unit adapted to select the first remaining usable time calculated by the first remaining usable time calculating unit or the second remaining usable time calculated by the second remaining usable time calculating unit, whichever is smaller; and a displaying unit adapted to display the selected remaining usable time.

In a second aspect of the present invention, there is provided an electronic apparatus having a battery pack with a secondary battery mounted therein, comprising: a first remaining usable time calculating unit adapted to calculate a first remaining usable time of the electronic apparatus based on a consumed current of the electronic apparatus; a second remaining usable time calculating unit adapted to calculate a second remaining usable time of the electronic apparatus based on a discharged current of the secondary battery; a selecting unit adapted to select the first remaining usable time when a deviation rate of the second remaining usable time calculated by the second remaining usable time calculating unit to the first remaining usable time calculated by the first remaining usable time calculating unit is not less than a predetermined amount; and a displaying unit adapted to display the selected remaining usable time.

In a third aspect of the present invention, there is provided an electronic apparatus having a battery pack with a secondary battery mounted therein, comprising: a first remaining usable time calculating unit adapted to calculate a first remaining usable time of the electronic apparatus based on a consumed current of the electronic apparatus; a second remaining usable time calculating unit adapted to calculate a second remaining usable time of the electronic apparatus based on a discharged current of the secondary battery; a calculating unit adapted to calculate an average value between the first remaining usable time calculated by the first remaining usable time calculating unit and the second remaining usable time calculated by the second remaining usable time calculating unit; and a displaying unit adapted to display the calculated average remaining usable time.

In a fourth aspect of the present invention, there is provided an electronic apparatus having a battery pack with a secondary battery mounted therein, comprising: a first remaining usable time calculating unit adapted to calculate a first remaining usable time of the electronic apparatus based on a consumed current of the electronic apparatus; a second remaining usable time calculating unit adapted to calculate a second remaining usable time of the electronic apparatus based on a discharged current of the secondary battery; a correcting unit adapted to correct the first remaining usable time calculated by the first remaining usable time calculating unit and the second remaining usable time calculated by the second remaining usable time calculating unit, respectively; a calculating unit adapted to calculate an average value between the corrected first remaining usable time and the corrected second remaining usable time; and a displaying unit adapted to display the calculated average remaining usable time.

In a fifth aspect of the present invention, there is provided a control method for an electronic apparatus having a battery pack with a secondary battery mounted therein, comprising: a first remaining usable time calculating step of calculating a first remaining usable time of the electronic apparatus based on a consumed current of the electronic apparatus; a second remaining usable time calculating step of calculating a second remaining usable time of the electronic apparatus based on a discharged current of the secondary battery; a selecting step of selecting the first remaining usable time calculated in the first remaining usable time calculating step or the second remaining usable time calculated in the second remaining usable time calculating step, whichever is smaller; and a displaying step of displaying the selected remaining usable time.

In a sixth aspect of the present invention, there is provided a control method for an electronic apparatus having a battery pack with a secondary battery mounted therein, comprising: a first remaining usable time calculating step of calculating a first remaining usable time of the electronic apparatus based on a consumed current of the electronic apparatus; a second remaining usable time calculating step of calculating a second remaining usable time of the electronic apparatus based on a discharged current of the secondary battery; a selecting step of selecting the first remaining usable time when a deviation rate of the second remaining usable time calculated in the second remaining usable time calculating step to the first remaining usable time calculated in the first remaining usable time calculating step is not less than a predetermined amount; and a displaying step of displaying the selected remaining usable time.

In a seventh aspect of the present invention, there is provided a control method for an electronic apparatus having a battery pack with a secondary battery mounted therein, comprising: a first remaining usable time calculating step of calculating a first remaining usable time of the electronic apparatus based on a consumed current of the electronic apparatus; a second remaining usable time calculating step of calculating a second remaining usable time of the electronic apparatus based on a discharged current of the secondary battery; a calculating step of calculating an average value between the first remaining usable time calculated in the first remaining usable time calculating step and the second remaining usable time calculated in the second remaining usable time calculating step; and a displaying step of displaying the calculated average remaining usable time.

In a eighth aspect of the present invention, there is provided a control method for an electronic apparatus having a battery pack with a secondary battery mounted therein, comprising: a first remaining usable time calculating step of calculating a first remaining usable time of the electronic apparatus based on a consumed current of the electronic apparatus; a second remaining usable time calculating step of calculating a second remaining usable time of the electronic apparatus based on a discharged current of the secondary battery; a correcting step of correcting the first remaining usable time calculated in the first remaining usable time calculating step and the second remaining usable time calculated in the second remaining usable time calculating step, respectively; a calculating step of calculating an average value between the corrected first remaining usable time and the corrected second remaining usable time; and a displaying step of displaying the calculated average remaining usable time.

According to the present invention, it is possible to correctly display the remaining usable time even if the discharged current of the battery pack is changed by the unexpected load due to the external apparatus connected.

The above and other objects, features, and advantages of the invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

Figure 1:
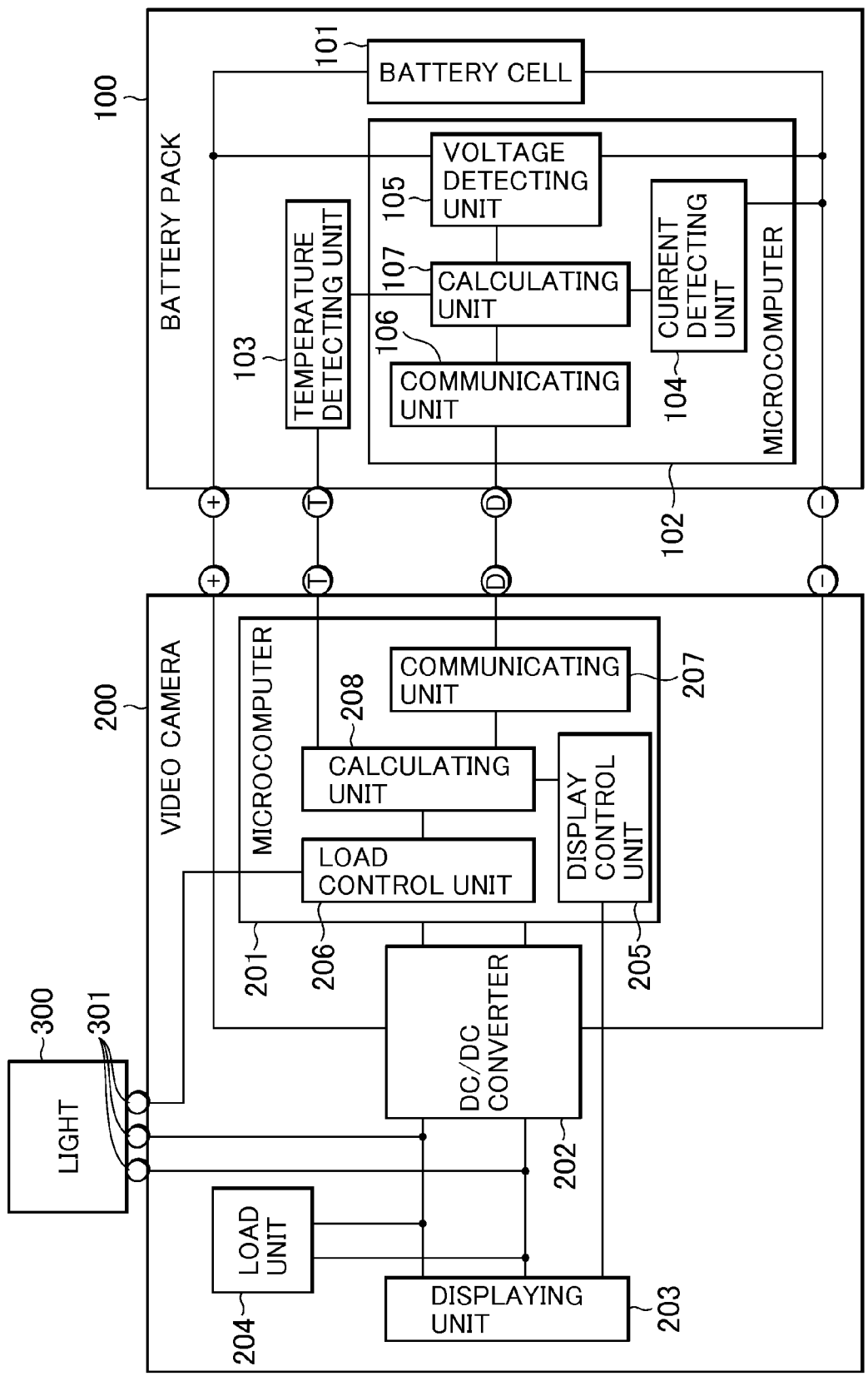
FIG. 1 is a view showing a configuration of a video camera as an electronic apparatus according to an embodiment of the present invention, and a battery pack thereof.

FIG. 1 is a view showing a configuration of a video camera as an electronic apparatus according to an embodiment of the present invention, and a battery pack thereof.

In FIG. 1, a video camera 200 is an example of the electronic apparatus according to the embodiment of the present invention, and is driven by the power delivered from a removable battery pack 100.

The battery pack 100 is provided with a battery cell 101, a microcomputer 102, and a temperature detecting unit 103. The battery cell 101 is a secondary battery such as a lithium-ion cell and a nickel-hydride cell. The temperature detecting unit 103 is composed of a temperature detecting element such as a thermistor. The temperature detecting unit 103 measures a voltage value obtained by dividing a reference voltage to measure a resistance value of a temperature detecting element, and calculates the temperature based on the measured resistance value of the temperature detecting element.

The microcomputer 102 is provided with a current detecting unit 104, a voltage detecting unit 105, a communicating unit 106, and a calculating unit 107. The current detecting unit 104 detects a charged/discharged current from voltage across a current detecting resistor (not shown), which is specifically referred to as a Coulomb counter. The Coulomb counter counts the amount of a charged current and a discharged current of charge from the voltage across the current detecting resistor, and divides the counted amount of current by a counted time to detect the charged current and the discharged current per time.

The voltage detecting unit 105 detects voltage of the battery cell 101. The communicating unit 106 communicates with the video camera 200. The calculating unit 107 calculates a remaining capacity of the battery cell 101 from each piece of information detected by the temperature detecting unit 103, the current detecting unit 104, and the voltage detecting unit 105. The calculated remaining capacity and the like may be stored in a memory (not shown) in the microcomputer 102.

The video camera 200 is provided with a microcomputer 201, a DC/DC converter 202, a displaying unit 203, and a load unit 204. The microcomputer 201 is provided with a display control unit 205, a load control unit 206, a communicating unit 207, a calculating unit 208, and a memory (not shown).

The DC/DC converter 202 converts a power from the battery cell 101 to a stabilized voltage, and delivers the stabilized voltage as a power to the microcomputer 201, the displaying unit 203, the load unit 204, and a light 300. The displaying unit 203 is composed of a display such as a liquid crystal panel, and displays the remaining usable time for the video camera 200. The load unit 204 is a load of the video camera 200 consuming a power. The display control unit 205 controls the displaying unit 203. The load control unit 206 controls the load unit 204. The communicating unit 207 communicates with the battery pack 100. The calculating unit 208 calculates the remaining usable time for the video camera 200 based on the remaining capacity of the battery cell 101.

The light 300 is configured to be detachably mounted on the video camera 200 by means of an accessory shoe 301, and is an external apparatus driven by the battery pack 100 mounted in the corresponding video camera 200. The external apparatus, which can be connected to the video camera 200 by means of the accessory shoe 301, includes a microphone, a flash, or the like in addition to the light 300. Such an external apparatus is, like the light 300, driven by the battery pack 100 mounted on the video camera 200.

In the video camera 200 according to the present embodiment, the calculating unit 208 calculates the remaining usable time, and the displaying unit 203 displays the remaining usable time.

A remaining usable time calculating process, which is executed by the calculating unit 208, will be described with reference to FIG. 2.

Figure 2:
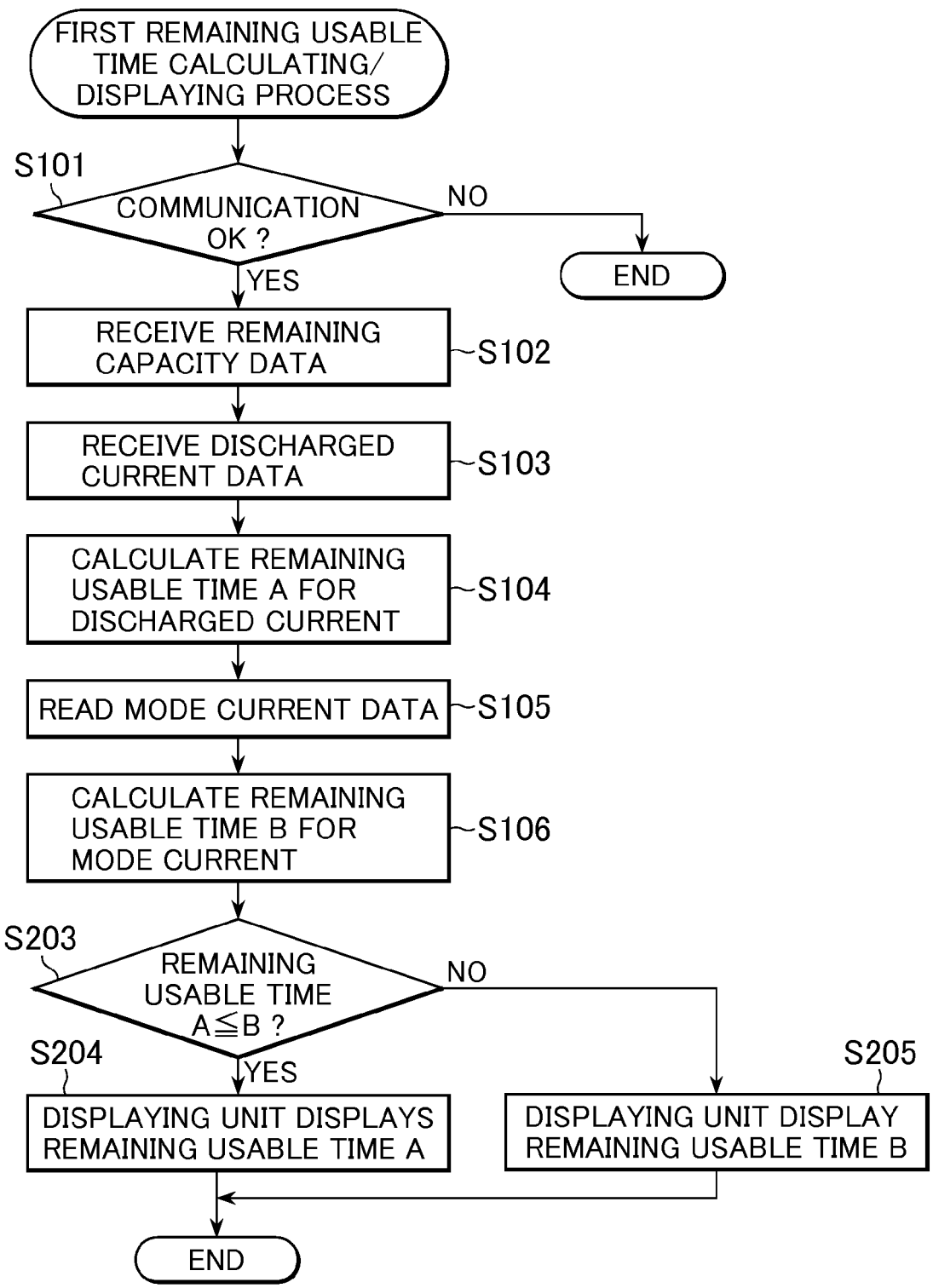
FIG. 2 is a flowchart showing the procedure of a first remaining usable time calculating/displaying process which is executed by the video camera of FIG. 1.

FIG. 2 is a flowchart showing the procedure of a first remaining usable time calculating/displaying process, which is executed by the video camera 200 of FIG. 1.

In FIG. 2, firstly, it is determined whether or not the video camera 200 can communicate with the battery pack 100 can be performed through the communicating unit 207 (step S101), and when the video camera 200 cannot communicate with the battery pack 100, this process is terminated, and when the video camera 200 can communicate with the battery pack 100, the process proceeds to step S102.

In step S102, the video camera 200 receives the remaining capacity data of the battery cell 101 from the battery pack 100 through the communicating unit 207. As described above, the remaining capacity data represents the remaining capacity of the battery cell 101 calculated by the calculating unit 107 in the battery pack 100.

In step S103, the video camera 200 receives discharged current data of the battery cell 101 from the battery pack 100 through the communicating unit 207. The discharged current data represents the discharged current detected by the current detecting unit 104. In step S104, the calculating unit 208 calculates the remaining usable time (hereinafter, referred to as "the remaining usable time A") of the video camera 200 for the discharged current (a second remaining usable time calculating step) based on the discharged current data received in the step S103, and stores the calculated remaining usable time A in the memory. While the remaining usable time of the electronic apparatus is calculated based on the discharged current in the steps S103 to S104, it may be calculated based on a power delivered from the secondary battery and the remaining capacity of the secondary battery.

In the step S105, mode current data is read from the memory. The mode current data represents a consumed current in each of a variety of operation modes (for example, a photographing mode, and the like) in the video camera 200. In step S106, the calculating unit 208 calculates the remaining usable time (hereinafter referred to as "the remaining usable time B") of the video camera 200 for the mode current based on the mode current data read in the step S105 (a first remaining usable time calculating step), and stores the calculated remaining usable time B in the memory. While the remaining usable time of the electronic apparatus is calculated based on the consumed current in the steps S105 to S106, it may be calculated based on a consumed power of the electronic apparatus and the remaining capacity of the secondary battery.

In step S203, the calculating unit 208 determines whether or not the remaining usable time A calculated in the step S104 is not greater than the remaining usable time B calculated in the step S106. As a result of this determination, when the remaining usable time A calculated in the step S104 is not greater than the remaining usable time B calculated in the step S106, the calculating unit 208 selects the remaining usable time A, and causes the displaying unit 203 to display the selected remaining usable time A through the display control unit 205 (step S204), followed by terminating the process.

On the other hand, when the remaining usable time A is greater than the remaining usable time B, the calculating unit 208 selects the remaining usable time B, and causes the displaying unit 203 to display the selected remaining usable time B through the display control unit 205 (step S205), followed by terminating the process.

According to the process of FIG. 2, the calculating unit 208 selects the remaining usable time A calculated based on the discharged current of the battery cell 101 (step S104) or the remaining usable time B calculated based on the consumed current of the video camera 200 (step S106), whichever is smaller, to cause the displaying unit 203 to display the selected remaining usable time (steps S204 and S205). Therefore, it is possible to correctly display the remaining usable time even if the discharged current of the battery pack 100 is changed by the unexpected load due to the external apparatus connected.

Not only the method of calculating the remaining usable time based on the discharged current and the remaining capacity of the battery pack 100, but also the method of calculating the remaining usable time based on the consumed current of the video camera 200 are considered. Thereby, it is possible to reduce an error of the remaining usable time due to the battery characteristic at the beginning of discharge.

Figure 3:
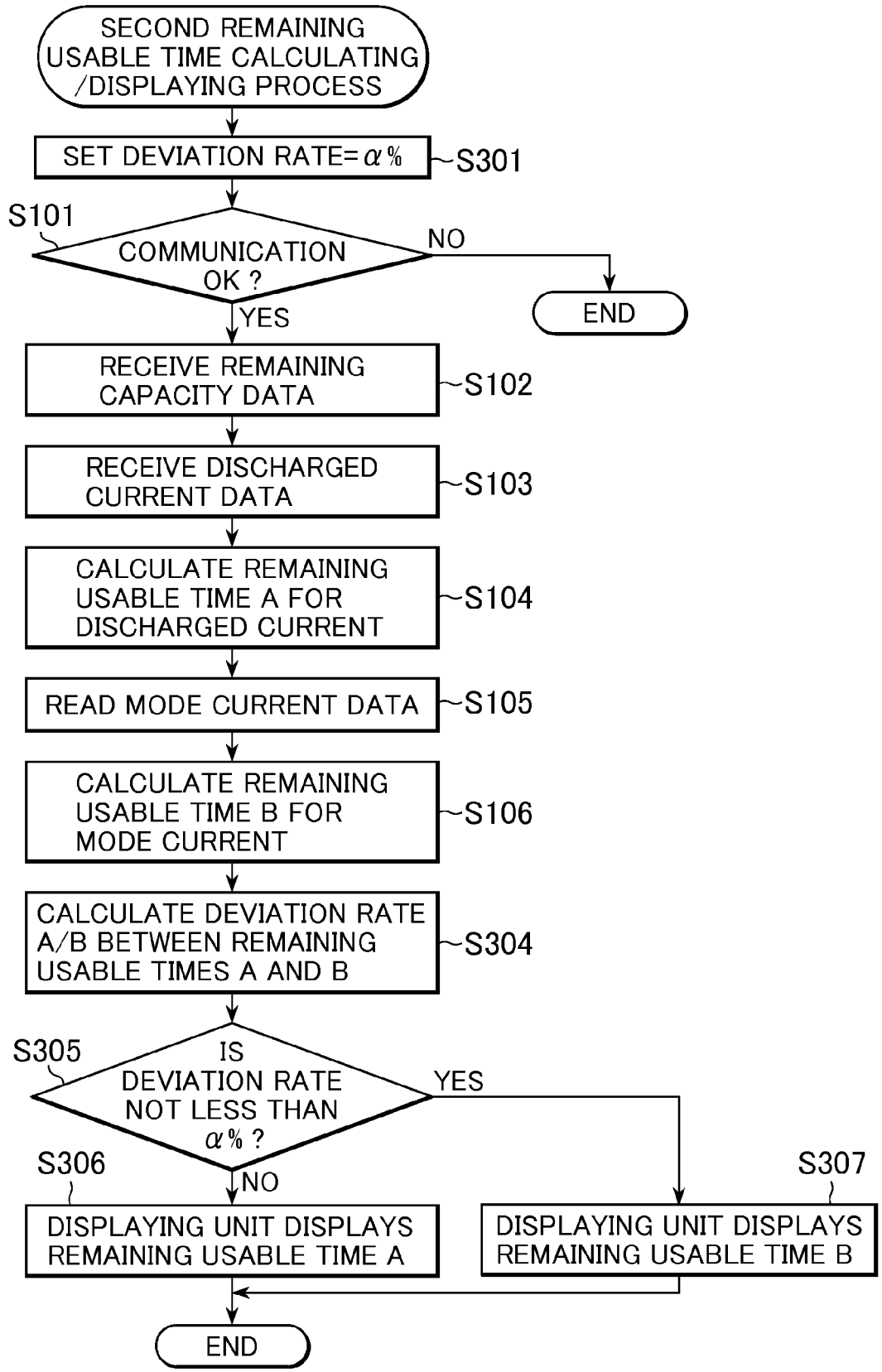
FIG. 3 is a flowchart showing the procedure of a second remaining usable time calculating/displaying process, which is executed by the video camera of FIG. 1.

FIG. 3 is a flowchart showing the procedure of a second remaining usable time calculating/displaying process which is executed by the video camera 200 of FIG. 1.

In the process of FIG. 3, like reference numerals are used for the similar parts to the process of FIG. 2, and description of which is, therefore, omitted. Only the points different from the above process of FIG. 2 will be described.

In the process of FIG. 3, the video camera 200 calculates a deviation rate between the remaining usable time A and the remaining usable time B, compares the calculated deviation rate with a predetermined deviation rate $\alpha\%$ to thereby select the remaining usable time to be displayed.

In FIG. 3, the calculating unit 208 sets the predetermined deviation rate $\alpha\%$ (step S301). Since the processing from the steps S101-S106 is the same as in the case of FIG. 2, description of which is, therefore, omitted.

In step S304, the calculating unit 208 calculates the deviation rate A/B of the remaining usable time A calculated in the step S104 to the remaining usable time B calculated in the step S106. Next, the calculating unit 208 determines whether or not the deviation rate A/B calculated in the step S304 is not greater than the deviation rate $\alpha\%$ set in the step S301 (step S305). When a result of the determination in the step S305 is affirmative (YES to the step S305), the calculating unit 208 selects the remaining usable time B, causes the displaying unit 203 to display the selected remaining usable time B through the display control unit 205 (step S307), followed by terminating the process.

On the other hand, when the result of the determination in the step S305 is negative (NO to the step S305), the calculating unit 208 selects the remaining usable time A, causes the displaying unit 203 to display the selected remaining usable time A through the display control unit 205 (step S306), followed by terminating the process.

According to the process of FIG. 3, the calculating unit 208 selects the remaining usable time B calculated based on the consumed current of the video camera 200 when the deviation ratio A/B is not less than the predetermined deviation rate, to cause the displaying unit 203 to display the selected remaining usable time B. This provides the same advantage as those of the above process of FIG. 2.

Figure 4:
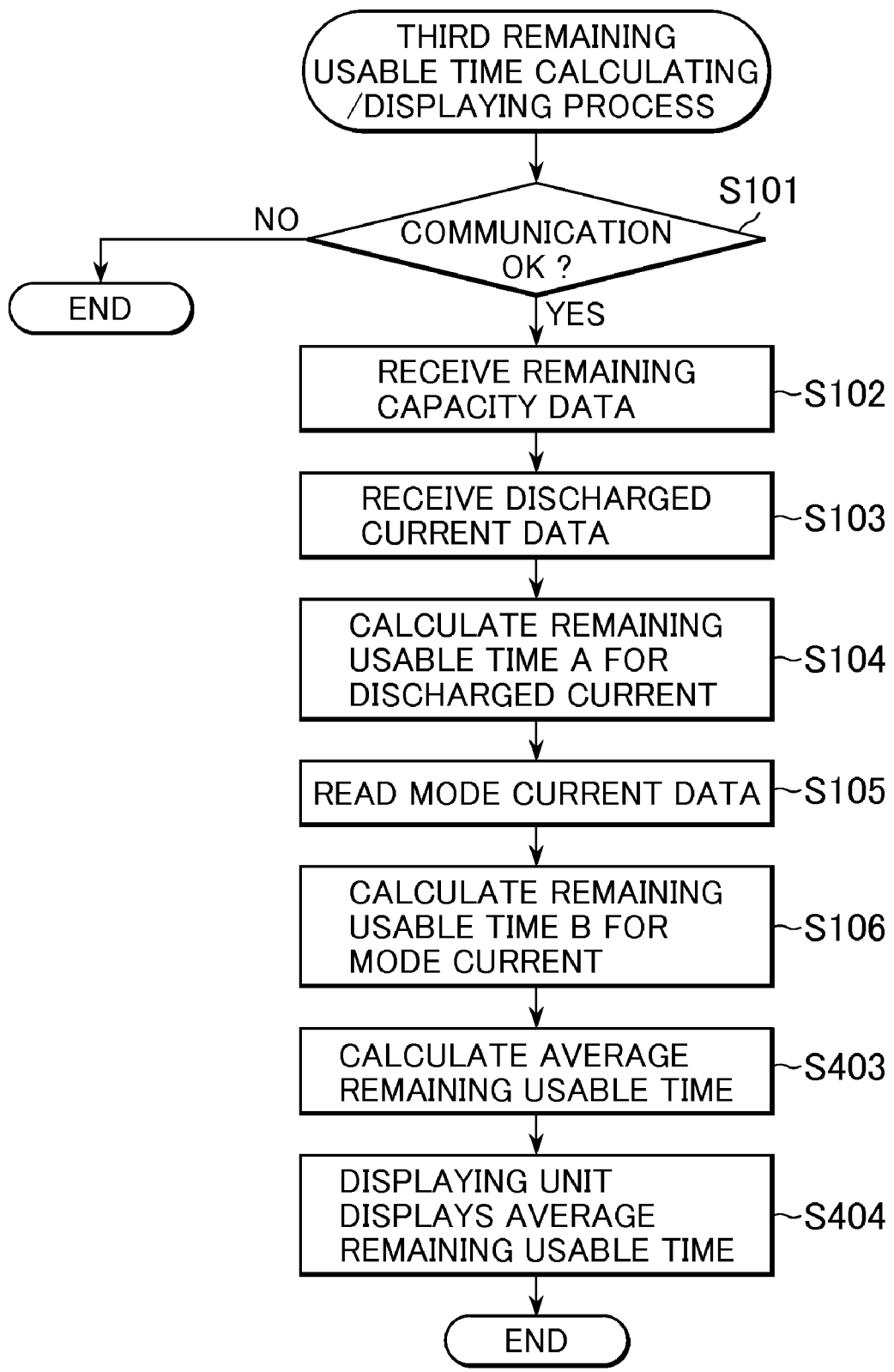
FIG. 4 is a flowchart showing the procedure of a third remaining usable time calculating/displaying process which is executed by the video camera of FIG. 1.

FIG. 4 is a flowchart showing the procedure of a third remaining usable time calculating/displaying process which is executed by the video camera 200 of FIG. 1.

In the process of FIG. 4, like reference numerals are used for the similar parts to the process of FIG. 2, and description of which is, therefore, omitted. Only the points different from the above process of FIG. 2 will be described.

In the process of FIG. 4, the video camera 200 selects the remaining usable time to be displayed based on an average value between the remaining usable times A and B.

In FIG. 4, since the processing from the steps S101-S106 is the same as in the case of FIG. 2, description of which is, therefore, omitted.

In step S403, the calculating unit 208 calculates an average value between the remaining usable time A calculated in the step S104 and the remaining usable time B calculated in the step S106. Next, in step S404, the calculating unit 208 causes the displaying unit 203 to display the average remaining usable time calculated in the step S403 through the display control unit 205, followed by terminating the process.

In the process of FIG. 4, while such a case is described that the number of the remaining usable times is two, when the number of the remaining usable times is three or more, an arbitrary number of the remaining usable times may be selected from a plurality of the remaining usable times, and the average value of the selected arbitrary number of the remaining usable times may be calculated.

According to the process of FIG. 4, the calculating unit 208 calculates the average value between the remaining usable time A calculated based on the consumed current of the video camera 200 (step S104) and the remaining usable time B calculated based on the discharged current of the battery cell 101 (step S106) (step S403), and causes the displaying unit 203 to display the calculated average remaining usable time (step S404). This provides the same advantages as those of the above process of FIG. 2.

Figure 5:
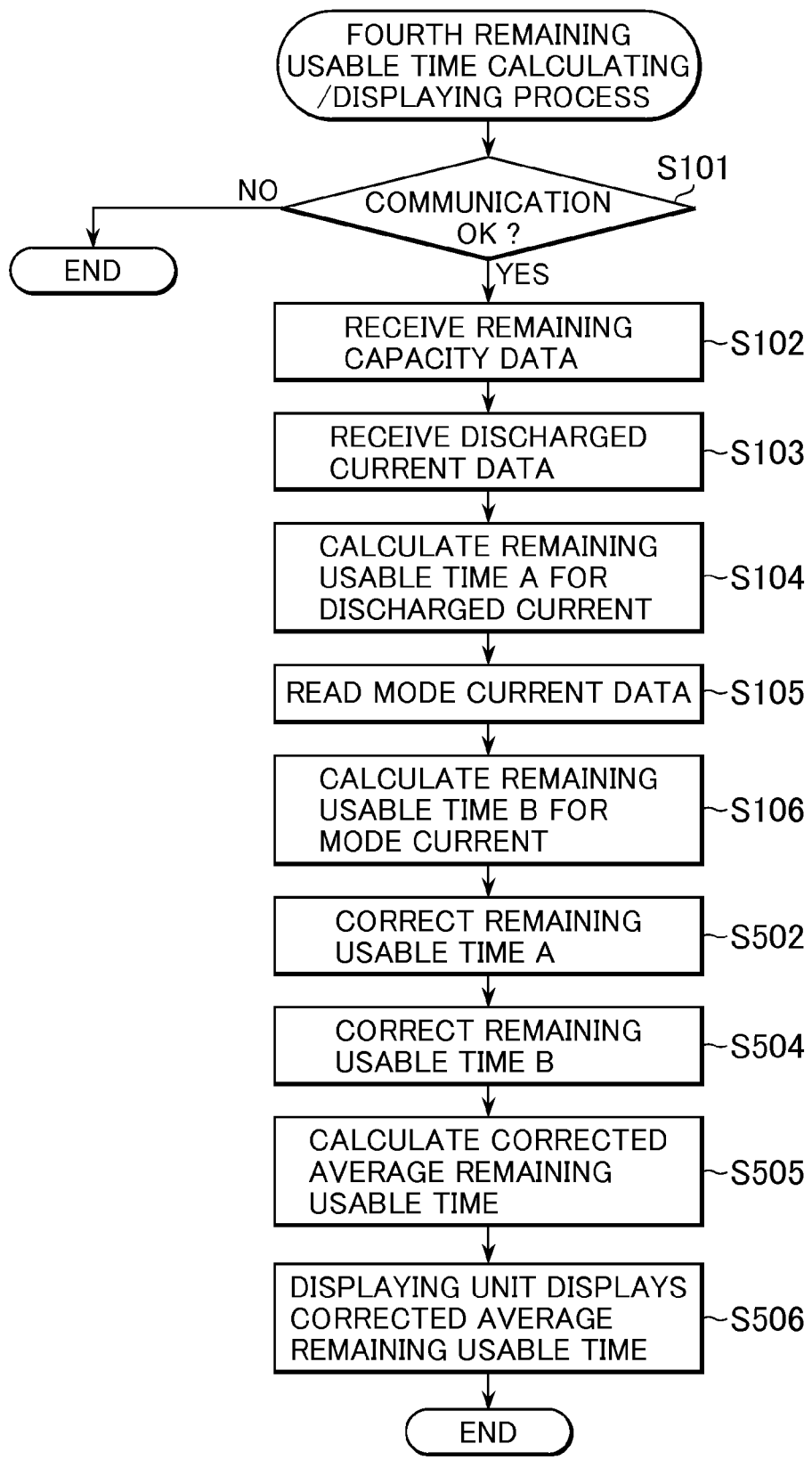
FIG. 5 is a flowchart showing the procedure of a fourth remaining usable time calculating/displaying process which is executed by the video camera of FIG. 1.
Figure 6:
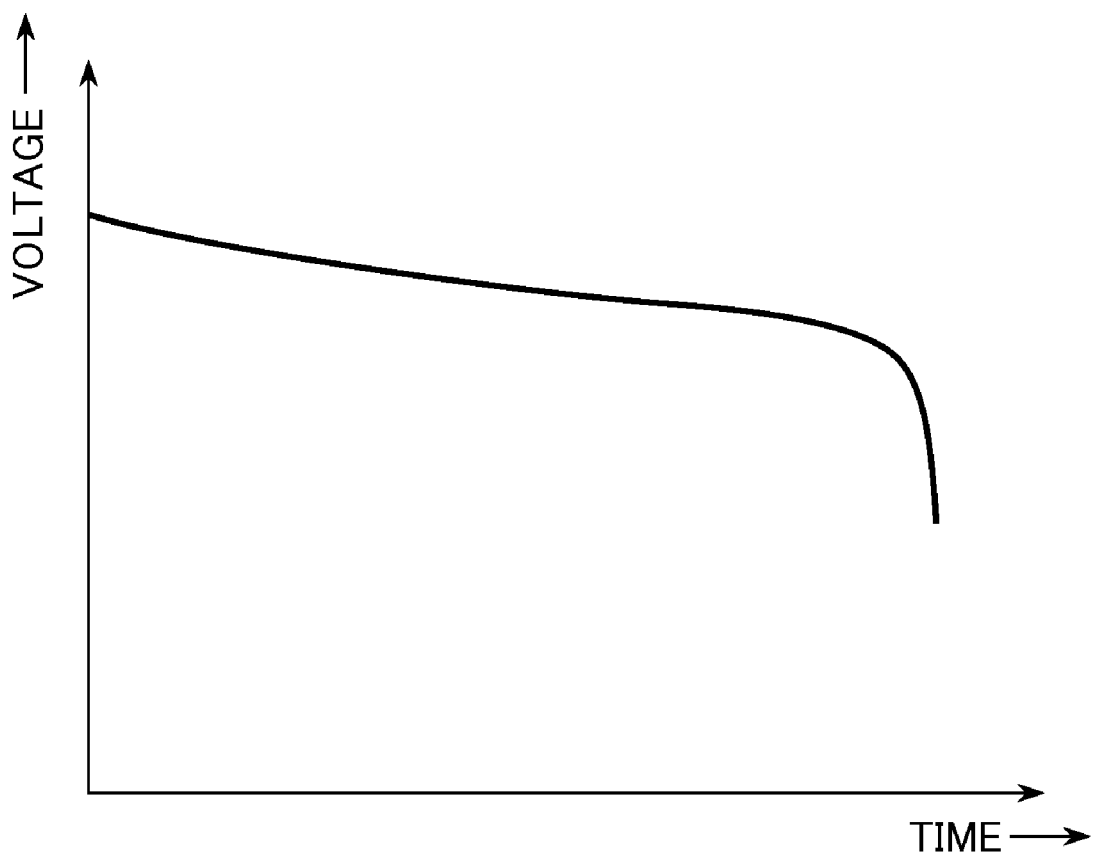
FIG. 6 is a graph showing a discharge characteristic for a constant power load of a conventional and general lithium-ion battery.

FIG. 5 is a flowchart showing the procedure of a fourth remaining usable time calculating/displaying process, which is executed by the video camera 200 of FIG. 1.

In the process of FIG. 5, the similar parts to the process of FIG. 2 will be described by using like reference numerals, and description of which is, therefore, omitted. Only the points different from the above process of FIG. 2 will be described.

In the process of FIG. 5, the video camera 200 corrects the remaining usable times A and B, and selects the remaining usable time to be displayed based on the average value between the corrected remaining usable times A and B.

In FIG. 5, since the process from the steps S101-S106 is the same as in the case of the process of FIG. 2, description of which is, therefore, omitted.

The calculating unit 208 corrects the remaining usable time A calculated in the step S104 (step S502). The correcting method includes an example of multiplying the remaining usable time by a correction coefficient depending on the usage environment or the characteristics of the battery cell 101. Next, the calculating unit 208 corrects the remaining usable time B calculated in the step S106 by the same correcting method as in the step S502 (step S504).

Next, the calculating unit 208 calculates an average value between the remaining usable time A corrected in the step S502 and the remaining usable time B corrected in the step S504 (step S505). Next, the calculating unit 208 displays the corrected average remaining usable time calculated in the step S505 on the displaying unit 203 through the display control unit 205 (step S506), followed by terminating the process.

According to the process of FIG. 5, the calculating unit 208 applies a predetermined correction to the remaining usable time A calculated based on the consumed current in the video camera 200 (step S502), and a predetermined correction to the remaining usable time B calculated based on the discharged current of the battery cell 101 (step S504). Next, the calculating unit 208 calculates the average value of the corrected remaining usable times (step S505), and causes the displaying unit 203 to display the calculated average remaining usable time (step S506). This provides the same advantages as those of the above process of FIG. 2.

In the process of FIG. 5, while such a case is described that the number of the remaining usable times is two, when the number of the remaining usable times is three or more, an arbitrary number of the remaining usable times may be selected from a plurality of the remaining usable times, and the average value of the selected arbitrary number of the remaining usable times may be calculated.

In each of the above processes of FIGS. 2 and 3, while description has been made to a case where the number of the remaining usable times is two, the present invention is not limited thereto, and the remaining usable time to be displayed may be calculated by using the three or more remaining usable times. The remaining usable time to be displayed may be calculated by selecting an arbitrary number of the remaining usable times from a plurality of the remaining usable times.

In each of the above processes of FIGS. 1 to 4, only when the external apparatus is connected to the electronic apparatus, a plurality of the remaining usable times may be calculated and selected as described above. This improves the process efficiency in the electronic apparatus.

It is to be understood that the object of the present invention may also be accomplished by supplying a system or an apparatus with a storage medium in which a program code of software which realizes the functions of the above described embodiment is stored, and causing a computer (or CPU or MPU) of the system or apparatus to read out and execute the program code stored in the storage medium. In this case, the program code itself read from the storage medium realizes the functions of any of the embodiments described above, and hence the program code and the storage medium in which the program code is stored constitute the present invention.

Examples of the storage medium for supplying the program code include a floppy (registered trademark) disk, a hard disk, a magnetic-optical disk, a CD-ROM, a CD-R, a CD-RW, a DVD-ROM, a DVD-RAM, a DVD-RW, a DVD+RW, a magnetic tape, a nonvolatile memory card, and a ROM. Alternatively, the program may be downloaded via a network.

Further, it is to be understood that the functions of the above described embodiment may be accomplished not only by executing a program cord read out by a computer, but also by causing an OS (operating system) or the like which operates on the computer to perform a part or all of the actual operations based on instructions of the program code.

Further, it is to be understood that the functions of the above described embodiment may be accomplished by writing a program code read out from the storage medium into a memory provided on an expansion board inserted into a computer or in an expansion unit connected to the computer and then causing a CPU or the like provided in the expansion board or the expansion unit to perform a part or all of the actual operations based on instructions of the program code.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2007-224555 filed Aug. 30, 2007, which is hereby incorporated by reference herein in its entirety.

What is claimed is:

1. An electronic apparatus, comprising:
a communicating unit that communicates with a battery pack including a secondary battery;
a first calculating unit that calculates a first remaining usable time of the electronic apparatus based on a consumed current of the electronic apparatus;
a second calculating unit that calculates a second remaining usable time of the electronic apparatus based on a discharged current of the secondary battery; and
a control unit that causes a display unit to display information indicating the first remaining usable time if the first remaining usable time is smaller than the second remaining usable time,
wherein the consumed current of the electronic apparatus is stored in a memory of the electronic apparatus, and the discharged current of the secondary battery is received via the communicating unit from the battery pack.

2. The electronic apparatus according to claim 1,
wherein the control unit that causes the display unit to display information indicating the second remaining usable time if the first remaining usable time is not smaller than the second remaining usable time.

3. The electronic apparatus according to claim 1,
wherein the consumed current of the electronic apparatus includes a current of the electronic apparatus in an operation mode.

4. An electronic apparatus, comprising:
a communicating unit that communicates with a battery pack including a secondary battery;
a first calculating unit that calculates a first remaining usable time of the electronic apparatus based on a consumed current of the electronic apparatus;
a second calculating unit that calculates a second remaining usable time of the electronic apparatus based on a discharged current of the secondary battery;
a control unit that causes a display unit to display information indicating the first remaining usable time if a deviation rate of the second remaining usable time to the first remaining usable time is not less than a predetermined value, and
wherein the consumed current of the electronic apparatus is stored in a memory of the electronic apparatus, and the discharged current of the secondary battery is received via the communicating unit from the battery pack.

5. The electronic apparatus according to claim 4,
wherein the control unit that causes the display unit to display information indicating the second remaining usable time if the deviation rate is less than the predetermined value.

6. The electronic apparatus according to claim 4,
wherein the consumed current of the electronic apparatus includes a current of the electronic apparatus in an operation mode.

7. An electronic apparatus, comprising:
a communicating unit that communicates with a battery pack including a secondary battery;
a first calculating unit that calculates a first remaining usable time of the electronic apparatus based on a consumed current of the electronic apparatus;
a second calculating unit that calculates a second remaining usable time of the electronic apparatus based on a discharged current of the secondary battery;
and
a control unit that causes a display unit to display information indicating an average of the first remaining usable time and second remaining usable time,
wherein the consumed current of the electronic apparatus is stored in a memory of the electronic apparatus, and the discharged current of the secondary battery is received via the communicating unit from the battery pack.

8. The electronic apparatus according to claim 7,
wherein the consumed current of the electronic apparatus includes a current of the electronic apparatus in an operation mode.

9. A control method for controlling an electronic apparatus including having a communicating unit that communicates with a battery pack including a secondary battery, the control method comprising:
calculating a first remaining usable time of the electronic apparatus based on a consumed current of the electronic apparatus;
calculating a second remaining usable time of the electronic apparatus based on a discharged current of the secondary battery;
causing a display unit to display information indicating the first remaining usable time if the first remaining usable time is smaller than the second remaining usable time, and
wherein the consumed current of the electronic apparatus is stored in a memory of the electronic apparatus, and the discharged current of the secondary battery is received via the communicating unit from the battery pack.

10. A control method for controlling an electronic apparatus including a communicating unit that communicates with a battery pack including a secondary battery, the control method comprising:
calculating a first remaining usable time of the electronic apparatus based on a consumed current of the electronic apparatus;
calculating a second remaining usable time of the electronic apparatus based on a discharged current of the secondary battery;
causing a display unit to display that information indicating the first remaining usable time if a deviation rate of the second remaining usable time to the first remaining usable time is not less than a predetermined value, and
wherein the consumed current of the electronic apparatus is stored in a memory of the electronic apparatus, and the discharged current of the secondary battery is received via the communicating unit from the battery pack.

11. A control method for controlling an electronic apparatus including a communicating unit that communicates with a battery pack including a secondary battery, the control method comprising:
calculating a first remaining usable time of the electronic apparatus based on a consumed current of the electronic apparatus;
calculating a second remaining usable time of the electronic apparatus based on a discharged current of the secondary battery;

causing a display unit to display information indicating an average of the first remaining usable time and the second remaining usable time, and wherein the consumed current of the electronic apparatus is stored in a memory of the electronic apparatus, and the discharged current of the secondary battery is received via the communicating unit from the battery pack.

12. A computer-readable recording medium storing a program to be executed by a computer, wherein the program for using the computer to perform a method of controlling an electronic apparatus including a communicating unit that communicates with a battery pack including a secondary battery, the method comprising:

calculating a first remaining usable time of the electronic apparatus based on a consumed current of the electronic apparatus;

calculating a second remaining usable time of the electronic apparatus based on a discharged current of the secondary battery;

causing a display unit to display information indicating the first remaining usable time if the first remaining usable time is smaller than the second remaining usable time, and wherein the consumed current of the electronic apparatus is stored in a memory of the electronic apparatus, and the discharged current of the secondary battery is received via the communicating unit from the battery pack.

13. A computer-readable recording medium storing a program to be executed by a computer, wherein the program for using the computer to perform a method of controlling an electronic apparatus including a communicating unit that communicates with a battery pack including a secondary battery, the method comprising:

calculating a first remaining usable time of the electronic apparatus based on a consumed current of the electronic apparatus;

calculating a second remaining usable time of the electronic apparatus based on a discharged current of the secondary battery;

causing a display unit to display information indicating the first remaining usable time if a deviation rate of the second remaining usable time to the first remaining usable time is not less than a predetermined value, and wherein the consumed current of the electronic apparatus is stored in a memory of the electronic apparatus, and the discharged current of the secondary battery is received via the communicating unit from the battery pack.

14. A computer-readable recording medium storing a program to be executed by a computer, wherein the program for using the computer to perform a method of controlling an electronic apparatus including a communicating unit that communicates with a battery pack including a secondary battery, the method comprising:

calculating a first remaining usable time of the electronic apparatus based on a consumed current of the electronic apparatus;

calculating a first remaining usable time of the electronic apparatus based on a consumed current of the electronic apparatus;

calculating a second remaining usable time of the electronic apparatus based on a discharged current of the secondary battery;

causing a display unit to display information indicating an average of the first remaining usable time and the second remaining usable time, and wherein the consumed current of the electronic apparatus is stored in a memory of the electronic apparatus, and the discharged current of the secondary battery is received via the communicating unit from the battery pack.

* * * * *